United States Patent [19] [11] 4,298,803
Matsuura et al. [45] Nov. 3, 1981

[54] PROCESS AND APPARATUS FOR MAKING FINE-SCALE PATTERNS

[75] Inventors: Shizuya Matsuura, Nara; Fumiya Konishi, Toyonaka, both of Japan

[73] Assignee: Matsushita Electric Industrial Co., Ltd., Osaku, Japan

[21] Appl. No.: 112,464

[22] Filed: Jan. 16, 1980

[30] Foreign Application Priority Data

Jan. 19, 1979 [JP] Japan ................................. 54-5092

[51] Int. Cl.³ ........................................... H01J 37/06
[52] U.S. Cl. ................................... 250/492.2; 250/398
[58] Field of Search ........... 250/440, 441, 453, 492 A, 250/398; 430/296, 311, 328, 494; 219/121 EB, 121 EM

[56] References Cited

U.S. PATENT DOCUMENTS 3,360,784 12/1967 Gaynor et al. ..................... 430/296
3,556,790 1/1971 Rust ................................... 430/494
4,007,047 2/1977 Kaplan et al. ..................... 430/328

Primary Examiner—Bruce C. Anderson
Attorney, Agent, or Firm—Burgess, Ryan and Wayne

[57] ABSTRACT

In a process for projecting or irradiating a pattern on a resist film or the like on a substrate such as a semiconductive wafer, the entire area of the resist film is subjected to a pre-exposure at an intensity less than a sensitivity or a critical exposure level of the resist film at which the resist at a selected (exposed or unexposed) area may be completely dissolved away and then a desired pattern is projected or irradiated on the pre-exposed resist film. These steps may be reversed. In both cases, the apparent sensitivity of the resist film may be improved so that the pattern making time may become very short. An apparatus for carrying out the above process is also disclosed.

17 Claims, 7 Drawing Figures

PROCESS AND APPARATUS FOR MAKING FINE-SCALE PATTERNS

BACKGROUND OF THE INVENTION

Prior Art

The present invention relates to a process and apparatus for making fine-scale patterns on resist films or the like on substrates such as semiconductive wafers.

In general, the photolithographic techniques have been used in order to make fine-scale patterns in the production of semiconductive devices by imaging a mask pattern of ultraviolet light onto a resist film or the like on a wafer. However when the width of a line becomes less than two microns, sharp definition cannot be obtained because of the diffraction of ultraviolet light. In order to overcome this drawback, deep ultraviolet rays, X-rays or an electron beam is used to make patterns consisting of lines with a width less than two microns. The materials which are sensitive to such rays are called photo resists, X-ray resists and electron beam resists, respectively.

The most important characteristics which determine the quality of resists are resolution or resolving power and sensitivity. The term "sensitivity" refers in this specification to "the level of exposure received by a resist whereby in the case of the positive type the resist at the exposed area is completely dissolved away or in the case of the negative type the resist in the exposed area remains undissolved". The term "resolving power" refers in this specification to "the minimum width of a line drawn". In general, the resists having a high resolving power have a poor or low sensitivity, and vice versa. A resist with a low sensitivity needs a high-intensity exposure in terms of the radiation energy per unit area. However, in practice, the resists must have both a high resolving power and a high sensitivity especially when lines with a width less than one micron are drawn. Especially the electron beam and X-ray resists must have such characteristics.

As compared with photolithography, the electron beam or the X-ray beam used in drawing fine-scale patterns on the resist films or the like has a small current density or a small dose so that a long exposure time is required, which is one of the most adverse factors influencing the mass production of semiconductor devices. Therefore, in the technology for drawing fine-scale patterns by electron beam, increasing the pattern drawing speed is the most pressing problem. Another problem is the elimination of the proximity effects due to "the action through medium" (which is very similar or very closely analogous to the intermittency effect in some sense) to be described in detail below.

In view of the above, one of the objects of the present invention is to provide a process for making fine-scale patterns on a resist film or the like which may drastically improve the apparent sensitivity of the resist film or the like used, whereby the desired effects may be attained which otherwise could never be attained without the use of an ideal resist material having both a high sensitivity and a high resolving power.

Briefly stated, the fine-scale pattern making process in accordance with the present invention comprises the steps of subjecting a resist film or the like to an exposure of an intensity less than the sensitivity of the resist film or the like and making desired fine-scale patterns (the step referred to as "the pattern making exposure" in this specification), whereby the pattern drawing speed may be considerably increased and the proximity effects due to the "action through medium" may be substantially eliminated.

SUMMARY OF THE INVENTION

Another object of the present invention is to increase the pattern drawing speed in the process for drawing fine-scale patterns on a resist film or the like on a substrate by increasing the apparent sensitivity of the resist film or the like.

A further object of the present invention is to provide a process and apparatus which may substantially eliminate the proximity effect due to the "action through medium"; that is, the phenomenon that the area between the adjacent structural features tends to be exposed to an undesired level when the spacing between them is too close.

A further object of the present invention is to provide an electron beam pattern making process and apparatus used for the production of semiconductor devices which may improve the pattern drawing speed and may ensure the pattern drawings with a higher degree of accuracy.

To the above and other ends, the present invention provides a process and apparatus, whereby a resist film or the like on a substrate is subjected to a pre-exposure at an intensity less than the sensitivity of the resist film or the like and then the resist film of the like is subjected to the pattern making exposure.

The apparatus of the present invention comprises a first exposure means for effecting the pattern making exposure and a second exposure means for exposing uniformly the entire area of a substantial part of the resist film or the like.

The above and other objects, effects, features and advantages of the present invention will become more apparent from the following description of some preferred embodiments thereof taken in conjunction with the accompanying drawings.

DESCRIPTION OF THE PREFERRED EMBODIMENTS

Figure 1:
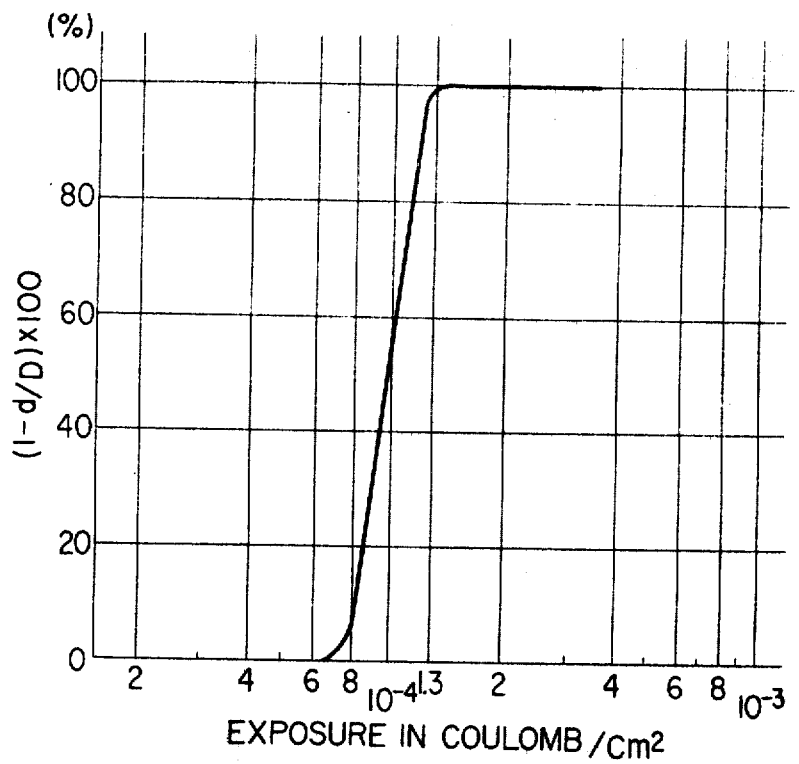
FIG. 1 is a graph showing the relationship between the exposure received by a positive type resist film or the like and the thickness of the resist film or the like after development.

The present invention will be described in detail in conjunction with the exposure of a positive type resist PMMA (poly-methyl methacrylate) coating with an electron beam, i.e. a ray of electrons with an extremely fine diameter or cross section so as to draw an extremely fine-scale pattern. The positive type PMMA resist is widely used in the fabrication of high density semiconductive devices in order to draw extremely fine-scale patterns with the electron beam and has the characteristic as shown in FIG. 1, wherein the intensity (coulomb/cm$^2$) of the electron beam is plotted along the abscissa while $[(1-d/D) \times 100\%]$, along the ordinate, where d is the thickness of the resist film at an exposed area after the development and D is the thickness of the resist film at an unexposed area after the development, the percentage showing the ratio of the resist dissolved. The characteristic curve as shown in FIG. 1 was obtained under the conditions to be described below. The surface of a single crystal silicon wafer was finished to a mirror finish and formed with a film of PMMA resist of 0.5 μm in thickness. The wafer was exposed with the electron beam of 20 KeV and immersed for development in the developing solution consisting of one part of methyl isobutyl ketone and two parts of isopropylalcohol, for one minute 30 seconds at 25° C.

It is seen from FIG. 1 that the PMMA resist has the sensitivity of $1.3 \times 10^{-4}$ coulomb/cm$^2$. When the intensity of the electron beam is less than $0.8 \times 10^{-4}$ coulomb/cm$^2$, a decrease in thickness of the resist film at an exposed area will not result after development. As the intensity is increased, the thickness of the resist film at an exposed area is reduced drastically. With the intensity of $1.3 \times 10^{-4}$ coulomb/cm$^2$ or higher the thickness of the resist film at an exposed area becomes zero after development. If the intensity is increased to, for instance, 100 times the sensitivity of the resist film, the resist which is exposed to the electron beam will become insoluble to the developing solution. The phenomena resulting from such overexposure will not be discussed in this specification.

The present invention is based upon the principle that when the entire area of the resist film on the wafer is subjected to a exposure (to be referred to as "the first exposure") prior to the exposure (to be referred to as "the second exposure") for imaging a pattern on the resist film, the intensity of the electron beam for the second exposure becomes the intensity required for complete exposure minus the intensity used for the first exposure. For instance, when the first exposure is made with the intensity of $0.8 \times 10^{-4}$ coulomb/cm$^2$, the second exposure is made with the intensity of $5 \times 10^{-5}$ coulomb/cm$^2$ (which is equal to $1.3 \times 10^{-4} - 0.8 \times 10^{-4}$ coulomb/cm$^2$).

When the resist film is exposed in two stages as described above, the following effects may be attained.

(1) The apparent sensitivity of the resist film may be considerably increased when a pattern is imaged. That is, when the resist film is subjected to the first exposure with the intensity of $0.8 \times 10^{-4}$ coulomb/cm$^2$, the apparent sensitivity becomes $5.0 \times 10^{-5}$ coulomb/cm$^2$ when a pattern is imaged. That is, as compared with the one-step exposure wherein the resist film is not subjected to the first exposure, the apparent sensitivity is increased by 2.6 times. When a decrease in the thickness of the resist film at an unexposed area (in the second exposure) after development is permitted the intensity of the first exposure may be further increased so that the apparent sensitivity may be further increased accordingly.

(2) The drawing speed; that is, the speed at which a pattern is drawn on the resist film may be considerably increased. When a fine-scale pattern is drawn with the electron beam, it is imperative that the electron beam be converged as finely as possible. However, the diameter of the electron beam is in general inversely proportional to the square root of the current of the electron beam so that with decrease in diameter of the electron beam, the current of the electron beam drops. As a result, the drawing speed drops. However when the resist film or coating has a high sensitivity to the electron beam, the drawing speed may be increased. For instance, when the apparent sensitivity is increased by 2.6 times as described above, the drawing speed may be also increased by 2.6 times. In the first exposure, it is not needed to converge the electron beam to an extremely fine diameter, the exposure time is very short as compared with the second exposure time. Thus, according to the present invention, the drawing speed may be considerably increased without increasing the current of the electron beam.

According to the present invention, in the pre-exposure or in the first exposure, the electron beam with a relatively large diameter may be used so that the pre-exposure or the first exposure may be completed within a very short time. In the second exposure, the intensity of the electron beam may be decreased. As a result the overall exposure time may be reduced. This is very advantageous in forming a fine-scale pattern with a higher degree of dimensional accuracy within a short time.

(3) The proximity effects due to the "action through medium" may be eliminated. When patterns to be drawn by the electron beam become less than some size, the resist film exhibits different sensitivities depending upon the sizes of the patterns. In general, the larger in size the patterns, the higher the sensitivity becomes. Such a phenomena as described above is called "the action through medium". That is, the resist film or coating is exposed not only by the electrons of the electron beam directly impinging thereon but also by the electrons that are reflected from the wafer after the electrons have passed through the resist film. In addition, the resist film is exposed with the X-rays and secondary electrons.

When the positive type resist film which has been exposed with the electron beam is developed, the resist is removed at an area slightly greater than the cross section of the electron beam and there remains some area adjacent to the dissolved area which is not dissolved but is exposed latently. As a result when a plurality of patterns which are spaced apart from each other by a very close distance are exposed on the same resist film on the wafer, the latently exposed areas overlap so that the exposure in such overlapped area becomes the sum of the latent exposures. As a result when the sum exceeds the sensitivity, the overlapped area is dissolved with the developing solution so that the spacing between the adjacent patterns becomes narrower than when there exists no effect of the "action through medium" as will be described in more detail below.

Figure 2:
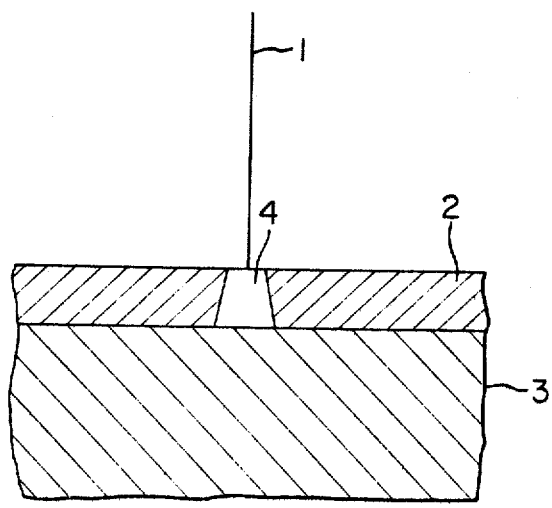
FIG. 2 is a view used for the explanation of the irradiation of the electron beam onto a resist film on a wafer.
Figure 3:
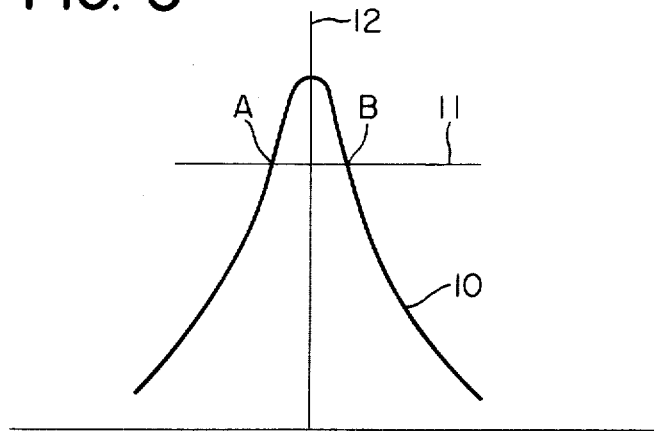
FIG. 3 shows the exposure distribution curve when one line segment is drawn in the manner as shown in FIG. 2.

FIG. 2 is a sectional view perpendicular to a line segment drawn on the resist film 2 with the electron beam 1. The resist film 2 is formed on one major surface of a semiconductive wafer 3 in which fine-scale patterns are made. After the development the area 4 is dissolved or removed. FIG. 3 shows the exposure distribution curve 10 in the area 4. The distance from the center of the area 4 is plotted along the abscissa while the exposure, along the ordinate. The horizontal line 11 indicates the sensitivity of the resist film 2 and the vertical line 12, the direction of the electron beam. The area which receives the exposure higher than the sensitivity line 11 is dissolved. That is, in FIG. 3, the area between A and B is dissolved.

Figure 4:
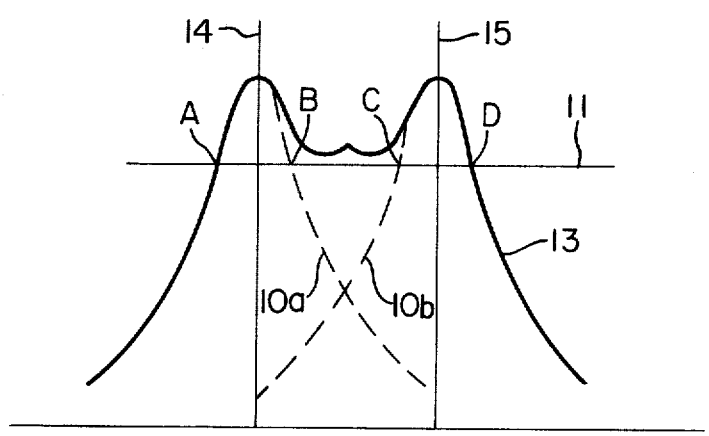
FIG. 4 shows the exposure distribution curve when to separate line segments are drawn by the electron beams.

FIG. 4 shows the exposure distribution curve 13 when two line segments with a relatively close spacing are drawn by the electron beams 14 and 15. The dashed curves 10a and 10b show the exposure distributions when only one of the two lines is drawn. If there were no effect of "the action through medium", the areas between A and B and between C and D would be dissolved, but in practice the area between A and D is dissolved because of the effect of "the action through medium" so that the two lines cannot be distinguished from each other.

Figure 5:
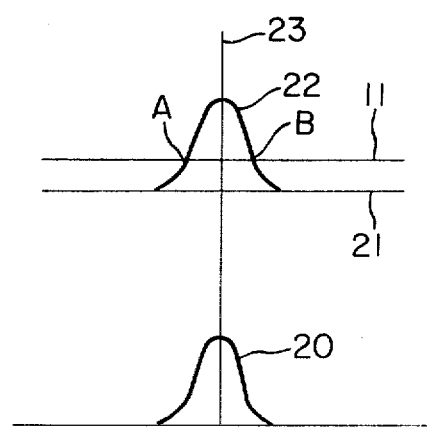
FIG. 5 shows the exposure distribution curve when one line segment is drawn by the electron beam according to the process of the present invention.
Figure 6:
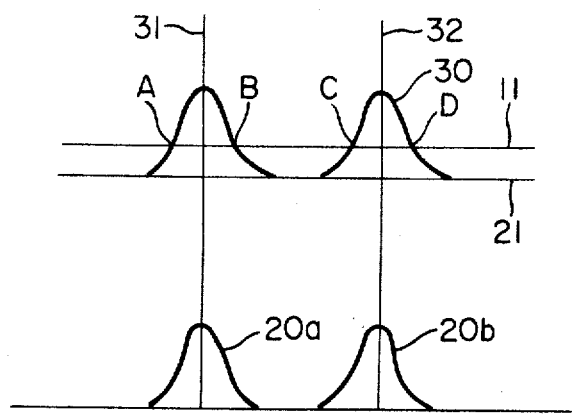
FIG. 6 shows the exposure distribution curves when two separate line segments are drawn by the electron beams according to the process of the present invention.

When one and two line segments are drawn in accordance with the present invention, the exposure distribution curves 22 and 30 are obtained as shown in FIGS. 5 and 6, respectively. When one line segment is drawn, the entire area of the resist film is subjected to the first exposure or pre-exposure to the level indicated by 21 in FIG. 5 and then the line segment is drawn by the electron beam 23 so that the resist film is exposed as indicated by the curve 20. Therefore, the curve 22 shows the sum of the first and second exposures 21 and 20 and the area between A and B which is higher than the sensitivity line 11 is dissolved.

When two line segments are drawn, the entire area of the resist film is subjected to the first exposure or pre-exposure to the level indicated by 21 and then two line segments are drawn by the electron beams 31 and 32 so that the resist film is exposed as indicated by the curves 20a and 20b in FIG. 6. Therefore the curves 30 indicate the sums of the first and second exposures 21 and 20a and 20b. The areas between A and B and between C and D above the sensitivity line 11 are dissolved.

Thus according to the present invention, the proximity effects of the "action through medium" may be substantially eliminated.

So far the present invention has been described in conjunction with the exposure of the PMMA resist film with an electron beam, but it is to be understood that the present invention may be equally applied to various combinations of resists and irradiation media used for making fine-scale patterns. For instance, the present invention may be applied to the exposure of the photo-sensitive resist films with ultraviolet rays or to the exposure by the X-rays of the X-ray sensitive resist films. In addition, the present invention may be equally applied to the exposure of either positive or negative resist films.

In the pre-exposure or the first exposure, any suitable beam sources may be used which may expose the resist film used in order to make fine-scale patterns. It is preferable to use a beam source which may avoid unevenness of exposure and may precisely control exposure. For instance, may be used the sources of the electron beam, the X-rays, the radiation rays, the deep ultraviolet rays and so on, but the use of the radiation ray source may attain the fastest exposure.

So far the present invention has been described as comprising the steps of pre-exposing the entire area of the resist film and then imaging a pattern thereon. As described with reference to FIGS. 5 and 6, the present invention may be effected in such a way that the exposure received by the area which is not exposed to a pattern image will not exceed the sensitivity or the critical exposure level of the resist film. Therefore it follows that first the second exposure or the pattern projection is effected and then the first exposure follows. It should be also noted that it is not necessary to subject the entire area of the resist film to the first exposure, but it suffices to expose only a desired area.

Figure 7:
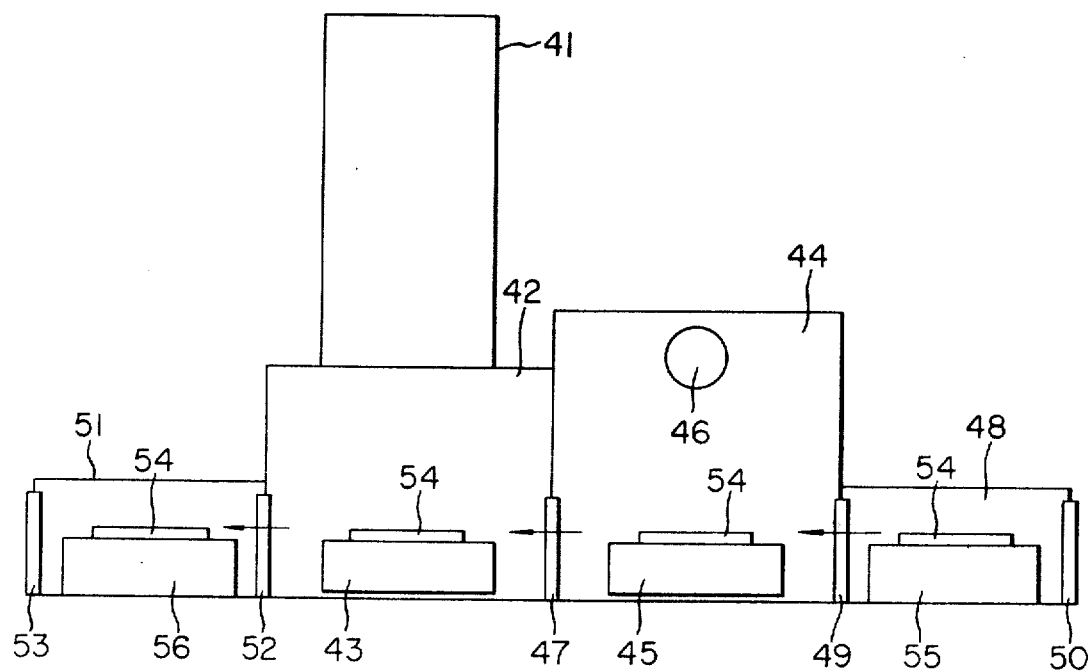
FIG. 7 is a schematic view of an electron beam pattern making apparatus in accordance with the present invention.

Next the present invention will be described in conjunction with an electron beam exposure apparatus. Referring to FIG. 7, in a lens barrel 41 the electron beam is produced, scanned and blanked one- or two-dimensionally and then directed toward the resist film on the wafer 54 mounted on a wafer stage 43 in a wafer chamber 42. The wafer stage 43 may be so designed and constructed as to be moved in two directions which are mutually perpendicular. A pre-exposure chamber 44 is installed adjacent to the wafer chamber or pattern making chamber 42 and is communicated with the chamber 42 through an air lock or sluice valve 47. Disposed within the pre-exposure chamber 44 are a wafer stage 45 and a radiation ray source 46 such as an X-ray tube, a deep ultraviolet lamp or a sealed radio active element.

A pre-evacuation chamber 48 is installed adjacent to the pre-exposure chamber 44 and is communicated therewith through an air lock or a sluice valve 49. The pre-evacuation chamber 48 is communicated with the exterior through an air lock or a sluice valve 50.

Another or second pre-evacuation chamber 51 is installed adjacent to and communicated with the wafer chamber or the pattern making chamber 42 through an air lock or a sluice valve 52 and is communicated with the exterior or the surrounding atmosphere through an air lock or sluice valve 53.

In operation, the wafer 54 is first charged into the first pre-evacuation chamber 48 through the air lock 50 and is mounted on the stage 55. After the sluice valve 50 has been closed, the chamber 48 is evacuated. Thereafter the sluice valve 49 is opened so that the wafer 54 is transferred into the pre-exposure chamber 44 wherein the wafer 54 is subjected to the first exposure or pre-exposure after the sluice valve 49 has been closed. During the pre-exposure, the stage 45 is rotated or oscillated one-dimensionally or two-dimensionally so that the unevenness of pre-exposure of the resist film on the wafer 54 may be avoided. Instead of rotating or oscillating the stage 45, the radiation source 46 may be rotated or oscillated.

After the wafer 54 has been pre-exposed in the manner described above, the sluice valve 47 is opened. It is essential to evacuate the pre-exposure chamber 44 to a degree substantially equal to the degree of vacuum in the pattern making chamber 42 before the sluice valve 47 is opened. The wafer 54 is transferred onto the stage 43 in the pattern making chamber 42 and the electron beam is irradiated to draw a desired pattern on the resist film on the wafer 54. After the pattern has been drawn, the sluice valve 52 is opened and the wafer 54 is transferred onto the stage 56 in the second pre-evacuation chamber 51. After the sluice valve 52 has been tightly closed, the air is introduced into the chamber 51 so that the pressure therein may rise to the atmospheric pressure. Next the sluice valve 53 is opened and the wafer 54 is discharged out of the chamber 51.

According to the present invention, the radiation source of a high intensity may be used in order to pre-expose the wafer 54 in the pre-exposure chamber 44. That is, the wafer 54 may receive a substantial part of the required exposure in the pre-exposure chamber 44 and the remaining exposure in the pattern making chamber 42.

Instead of the electron beam, the X-ray, violet or deep ultraviolet beam may be used. Furthermore the wafer 54 may be subjected to the pattern making exposure first and then to the after exposure.

In the apparatus shown in FIG. 7, the wafer 54 is charged first into the first pre-evacuation chamber 48 from the exterior or the surrounding atmosphere and transferred through the pre-exposure chamber 44, the pattern making chamber 42 and the second pre-evacuation chamber 51 from which the wafer 54 is discharged into the exterior. The transfer of the wafer 54 may be synchronized with the pre-exposure and pattern making exposure operations so that the wafers may be automatically processed.

In the present invention, in place of the above described PMMA, one of the following resists, for instance, may be used for making fine-scale patterns.

Positive type

P(MMA-Co-MA)—(Poly Methyl Methaacrylate-Co-Mathacrylic Acid)
P(MMA-Co-AN)—(Poly Methyl Methacrylic-Co-Acrylonitrile)
PBS—(Poly Butene-Sulphone)
PMIPK—(Poly Methyl Isopropenyl Ketone)
FMR-E101—(Name of commodity of Fuji Chemical Industrial Co., Ltd. in Japan)
FBM—(Name of commodity of Tokyo Ohka Kogyo Co., Ltd. in Japan)

Negative type

EPB—(Epoxide Poly Butadiene)
PGMA—(Poly Glycidyl Methacrylate)
P(GMA-Co-EA)—(Poly Glycidyl Methacrylate-Co-Ethyl Acrylate)
SEL-N—(Name of commodity of SOMAR Manufacturing Co., Ltd. in Japan)

In summary, according to the present invention, a time required for drawing a fine-scale pattern on a resist film on a wafer may be drastically reduced. In addition, the proximity effects of the "action through medium" may be eliminated so that the precise pattern making may be ensured. Thus the present invention greatly contributes to the production of the semiconductive devices of all kinds.

What is claimed is:

1. In a process for making fine-scale patterns of a resist by projecting a radiation pattern on a resist film disposed on a substrate, said film having a predetermined sensitivity threshold level to said radiation such that a radiaton intensity below said sensitivity threshold level does not sensitize the film, the improvement comprising the steps of:
    projecting said radiation pattern on said resist film at a first intensity; and thereafter substantially uniformly exposing a desired area of said resist film to radiation at a second intensity less than said sensitivity threshold level,
    the sum of said first and second intensities being greater than said sensitivity threshold level.

2. In a process for making fine-scale patterns of a resist by projecting a radiation pattern on a resist film disposed on a substrate, said film having a predetermined sensitivity threshold level to said radiation such that a radiation intensity below said sensitivity threshold level does not sensitize the film, the improvement comprising:
    a main step of projecting said radiation pattern on said resist film at a first intensity; and
    a separate auxiliary step of substantially uniformly exposing a desired area of said resist film to radiation at a second intensity less than said sensitivity threshold level,
    the sum of said first and second intensities being greater than said sensitivity threshold level.

3. The improvement according to claim 2, wherein said auxiliary step is carried out before said main step.

4. The improvement according to claim 1, 2 or 3, wherein said first intensity is less than said sensitivity threshold level.

5. The improvement according to claim 1, 2 or 3, wherein said substrate comprises a semiconductor material.

6. The improvement according to claim 2 or 3, wherein said radiation pattern is provided by a radiation source and said source and substrate are moved relative to each other during said auxiliary step.

7. The improvement according to claim 2 or 3, wherein an electron beam is used to project the radiation pattern during said main step.

8. The improvement according to claim 7, wherein said electron beam is scanned over selected portions of said resist film during said main step.

9. The improvement according to claim 7, wherein said main step is carried out in an evacuated chamber.

10. In an arrangement for making fine-scale patterns of a resist by projecting a radiation pattern on a resist film disposed on a substrate, said film having a predetermined sensitivity threshold level to said radiation such that a radiation intensity below said sensitivity threshold level does not sensitize the film, the improvement comprising:
    a first chamber having main exposure means for projecting said radiation pattern on said resist film at a first intensity; and
    a second chamber having auxiliary exposure means for substantially uniformly exposing a desired area of said resist film to radiation at a second intensity less than said sensitivity threshold level,
    the sum of said first and second intensities being greater than said sensitivity threshold level.

11. The improvement according to claim 10, wherein said chambers are evacuated.

12. The improvement according to claim 11, further comprising a first pre-evacuation chamber preceding said first chamber and a second pre-evacuation chamber preceding said second chamber.

13. The improvement according to claim 11 or 12, wherein said main and auxiliary exposure means each comprise an electron beam apparatus.

14. The improvement according to claim 11, wherein said first and second chambers are each provided with air lock means.

15. The improvement according to claim 10, wherein and resist comprises poly-methyl methacrylate.

16. The improvement according to claim 10, wherein said main exposure means comprises an X-ray beam.

17. The improvement according to claim 10, wherein said main exposure means comprises an ultraviolet ray beam.

* * * * *